(12) United States Patent
Kumar et al.

(10) Patent No.: US 9,997,214 B1
(45) Date of Patent: Jun. 12, 2018

(54) LEVELSHIFTER-LESS OUTPUT BUFFER WITH HYBRID DRIVER FOR HIGH SPEED AND LOW SUPPLY MEMORY APPLICATIONS

(71) Applicant: Cadence Design Systems, Inc., San Jose, CA (US)

(72) Inventors: Vinod Kumar, Uttar Pradesh (IN); Tara Vishin, Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days. days.

(21) Appl. No.: 15/637,711

(22) Filed: Jun. 29, 2017

(51) Int. Cl.
| | |
|---|---|
| *G11C 7/00* | (2006.01) |
| *G11C 7/10* | (2006.01) |
| *G11C 14/00* | (2006.01) |
| *G11C 5/14* | (2006.01) |
| *G11C 11/40* | (2006.01) |
| *H03K 19/173* | (2006.01) |
| *H03K 19/00* | (2006.01) |
| *H03K 19/0185* | (2006.01) |

(52) U.S. Cl.
CPC ............ *G11C 7/1057* (2013.01); *G11C 5/147* (2013.01); *G11C 11/40* (2013.01); *G11C 14/0009* (2013.01); *H03K 19/0005* (2013.01); *H03K 19/018521* (2013.01); *H03K 19/1733* (2013.01)

(58) Field of Classification Search
CPC ....... G11C 7/1057; G11C 5/147; G11C 11/40; G11C 14/0009
USPC ............. 365/189.11, 189.05, 230.06, 233.13
See application file for complete search history.

(56) References Cited

U.S. PATENT DOCUMENTS

| | | | |
|---|---|---|---|
| 6,313,671 B1 * | 11/2001 | Le .................... | H03K 19/00315 326/27 |
| 9,525,421 B2 * | 12/2016 | Potluri ............ | H03K 19/17744 |
| 9,754,646 B1 | 9/2017 | Kumar et al. | |
| 2009/0091358 A1 * | 4/2009 | Chauhan .......... | H03K 19/00384 327/108 |

\* cited by examiner

*Primary Examiner* — Vu Le
(74) *Attorney, Agent, or Firm* — Vista IP Law Group, LLP

(57) ABSTRACT

Disclosed is an architecture for an output driver that does not employ level shifters in the high speed data path. Since the proposed architecture is free from level shifters in the high speed data path, it provides better performance across PVT corners. The disclosed output driver usages a hybrid pullup driver which makes it compatible for the wide range of DRAM supply range. This approach allows for significant savings for electronic design area and dynamic power.

22 Claims, 11 Drawing Sheets

LEVELSHIFTER-LESS OUTPUT BUFFER WITH HYBRID DRIVER FOR HIGH SPEED AND LOW SUPPLY MEMORY APPLICATIONS

BACKGROUND

As computing and processing technologies improve over time, there is a commiserate need for advances in memory technology as well. This is because the increase in speed of processors requires a similar increase in speed of memory components, such as DRAMS (Dynamic Random Access Memory), to boost overall system performance. For example, the target speed for LPDDR4X DRAM is up to 5.4 Gbps, while the target speed for LPDDR5 DRAM is up to 6.4 Gbps.

At the same time the target speeds of DRAM are increasing, the IO (Input/Output) interface supply (VDDQ) for DRAMs is also being reduced to reduce the dynamic power of the DRAM product. In the advance generations of DRAMs, the target VDDQ supply for DRAM products, such as for example, LPDDR4X DRAM is 0.6V to 0.4V and the target VDDQ supply for LPDDR5 DRAM is 0.5V to 0.3V.

The issue being addressed by the present disclosure is that as target speeds increase for memory technology, this leads to potential problems that arise for conventional output drivers, particularly in combination with the reduction of supply voltages for these circuits. One reason is because as the VDDQ supply may be near the threshold voltage of the output driving devices, this means that the output driver may present large variations in its drive. In addition, challenges exist for conventional output drivers associated with ensuring the linearity of the output driver impedance with respect to the output voltage. To address these problems, conventional output drivers would need to increase the size of the output driving devices. However, this leads to excessive design footprint requirements for the circuit design, as well as leading to excessive power requirements.

Therefore, there is a need for an improved approach to implement output drivers for memory technologies. In particular, there is a need for an improved approach to implement output drivers for memory components that can both handle the higher levels of target speeds of advanced memory designs, as well as the requirement for lower supply voltages.

BRIEF DESCRIPTION OF FIGURES

The drawings illustrate the design and utility of some embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Embodiments of the invention provide an improved architecture for an output driver that does not employ level shifters in the high speed data path. Since the proposed architecture is free from level shifters in the high speed data path, this provides better performance across PVT (process, temperature, voltage) corners. Since high speed data level shifter is not needed any further in the data path, there can be significant savings for design area and dynamic power.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration. For example, while the illustrative examples described below are described in the context of DRAM memory components, it is noted that the inventive concepts described herein are applicable to other types of memory technologies as well, and are not to be limited only to DRAM applications unless explicitly claimed as such.

Figure 1:
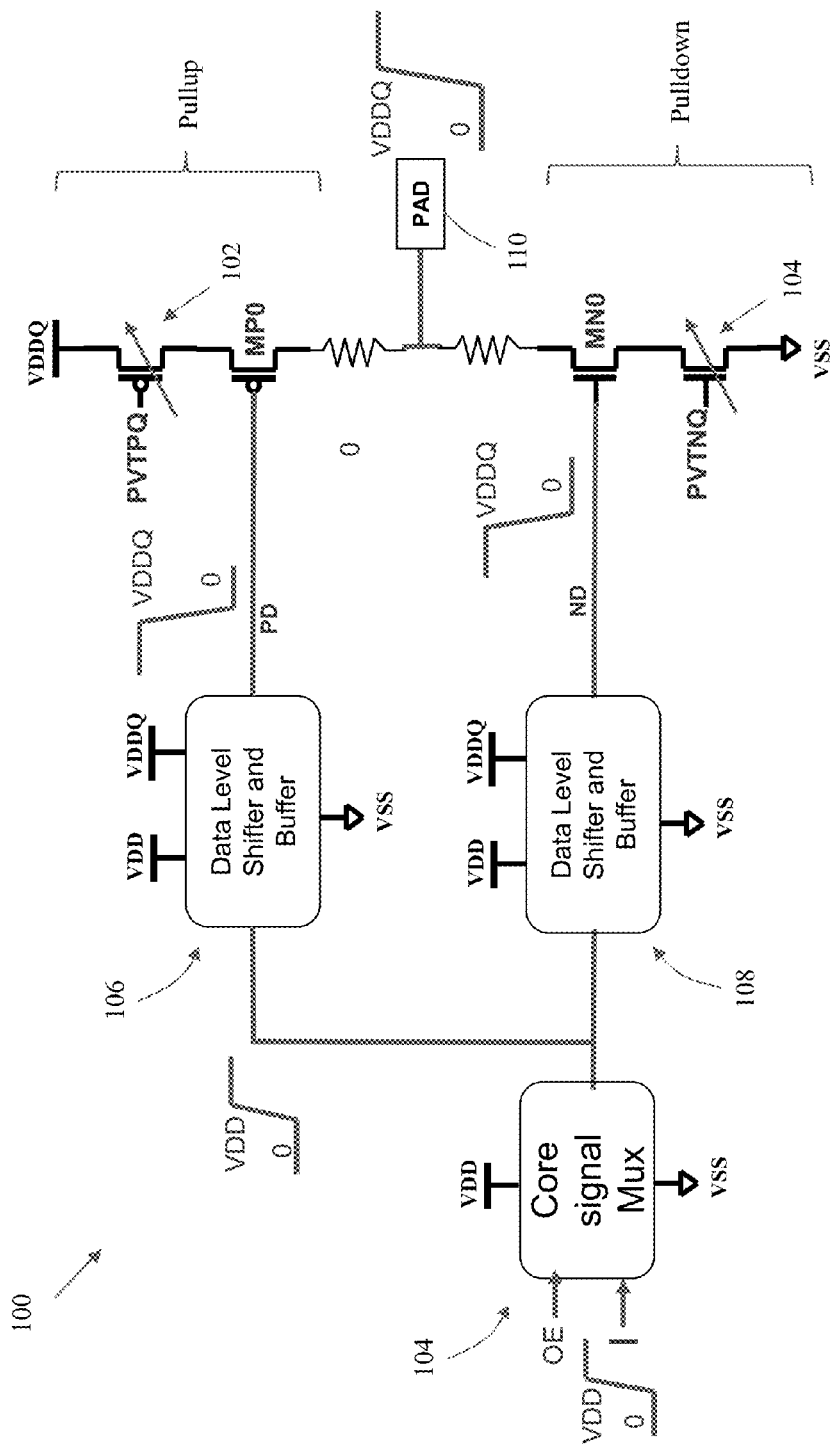
FIG. 1 illustrates an example output driver architecture.

Before describing embodiments of the invention, this disclosure will first discuss alternative output driver designs that are problematic and sub-optimal. FIG. 1 illustrates an example architecture 100 having a push-pull design for implementing a DRAM output driver. The top portion of the figure includes PMOS transistors to implement a "pullup" circuitry, while the bottom portion includes NMOS transistors to implement a "pulldown" circuitry.

The input signals are provides at the core signal mux 104 at a first voltage supply level VDD. One of the key functions of the output driver is to generate output signals at the VDDQ voltage level expected at the output pad 110. Therefore, the pullup portion includes a level shifter 106 to shift the signal level from VDD to VDDQ, while the pulldown path includes a similar level shifter 108. The pullup portion includes a variable transistor 102 to manage the impedance range of the output, given PVT variations that may exist in the electronic product. "PVTPQ" corresponds to PVT dependent signals that are applied to transistor 102 to control pull-up impedance across different PVT variations. The bottom portion of the figure similarly includes devices to implement the pulldown circuitry. For example, the pulldown portion includes a variable transistor 104 to manage the impedance range of the output for different PVT conditions by PVTNQ signals.

The approach shown in FIG. 1 suffers from certain problems, particularly where VDDQ is varying from 0.3V to 0.6V, e.g., where a high performance data level shifter is working up to 6.4 Ghz. To explain, consider the situation when the VDDQ supply voltage is at 0.3V at the same time the DRAM is being used for high-speed applications. For this architecture to work in this situation, VDDQ has to be higher than the threshold voltage of the transistor 102 to allow PMOS transistor 102 to turn on. If VDDQ (e.g., 0.3V) is less than the threshold voltage (e.g., 0.4V) of transistor 102, then transistor 102 will not turn on, and therefore this architecture cannot be used to implement DRAMs driver for this type of high-speed application.

In addition, since the VDDQ supply is near to the threshold voltage of the output driving devices (MN0 and MP0), this means that the output driver may show a large variation in its drive with respect to change in the PVT. Moreover, since the overdrive for MN0 and MP0 is very small, this creates challenges associated with ensuring the linearity of the output driver impedance with respect to the output voltage.

As a result, if the overdrive for MN0 and MP0 is very small, then the size needed for MN0 and MP0 is extremely large—especially when VDDQ is 0.3V. The large size of MN0 and MP0 shows high loading for the previous stages of the driver, and hence the effective area and power needed for the convention output driver architecture becomes extremely large.

Figure 2:
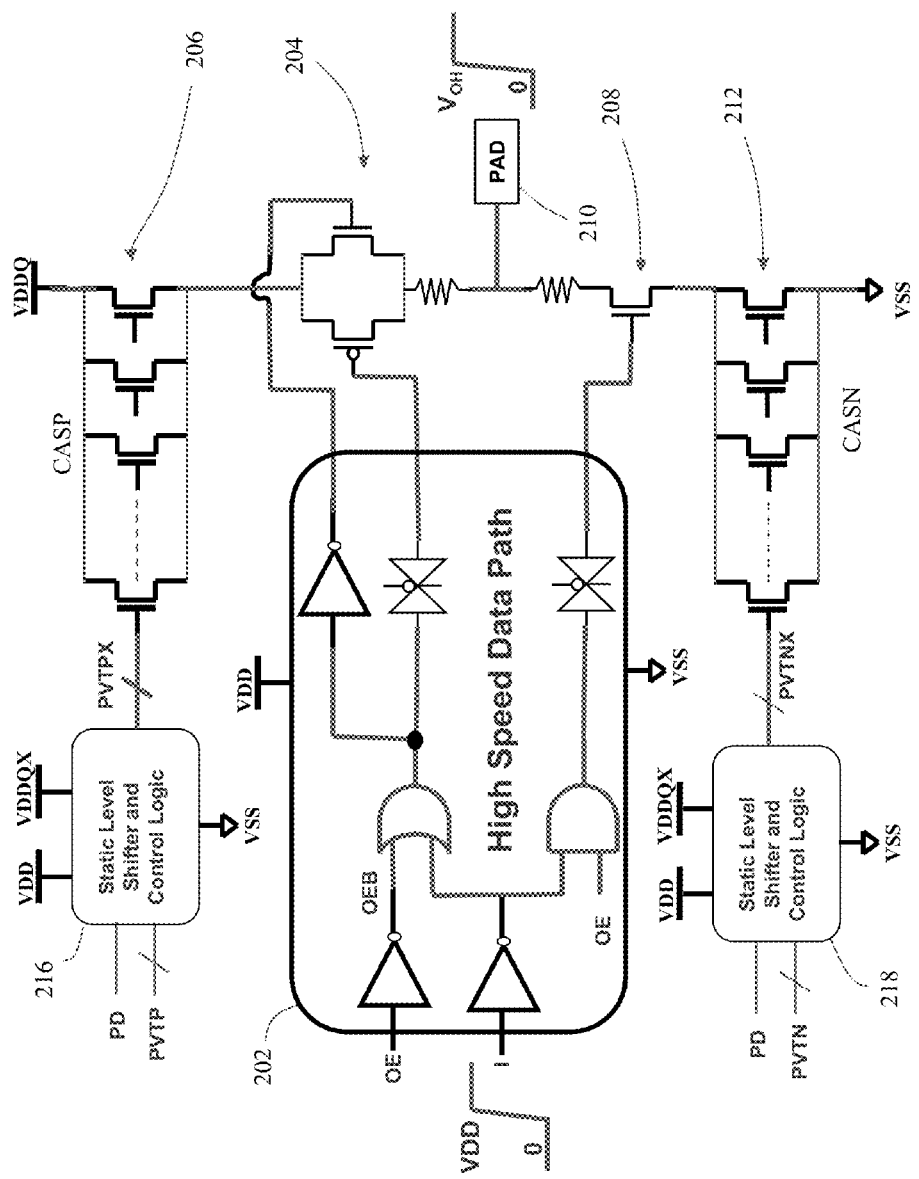
FIG. 2 provides an illustration of an improved architecture for implementing output drivers according to some embodiments of the invention.

FIG. 2 provides an illustration of an improved architecture for implementing output drivers according to some embodiments of the invention that solves these problems. This improved architecture removes the level shifter from the high speed data path. Instead, the high speed data path will only include a control/buffering architecture 202 to handle the incoming signals. The output driver is constructed by using a cascode combination of thin-gate devices 204 and thick-gate devices 206. The gate voltage of the thin-gate devices 204 are of core supply VDD level. The gate voltage of thick-gate devices 206 are of VDDQX level.

Devices 206 include a plurality of thick-oxide NMOS devices for pullup impedance control across different PVTs. A static level shifter 216 performs level shifting functionality from the VDD voltage level to a VDDQX voltage level. The additional supply VDDQX is provided which is at least one threshold voltage higher than the VDDQ supply. The use of the additional supply VDDQX reduces the size of thick-gate devices used in the driver significantly and hence it reduces the driver area. In some embodiments, as per JEDEC standard, the additional supply VDDQX can be used for LPDDR4X and LPDDR5 Memories.

The pullup path includes hybrid driver 204 having a design pull data path on the core supply voltage VDD to the main driver. The cascode thin-gate devices 204 in the pull driver are a parallel combination of NMOS and PMOS devices. The use of the parallel combination of thin-gate PMOS and NMOS in the pull-up path of driver makes the proposed architecture compatible for both LPDDR4X and LPDDR5 modes. In some embodiments, rather than using thick-oxide devices, the transistors within the hybrid driver 204 are implemented as thin-oxide ultra-low $V_{th}$ devices. The use of ultra-low $V_{th}$ devices makes the output pull-up impedance more linear across the full VDDQ range.

In the pulldown path, a thin-oxide device 208 is employed to drive the output. In addition, the pulldown portion of the architecture includes a "PVTN" signal that corresponds to the PVT dependent codes which are used to control the pull-down impedance across PVT with respect to the thick oxide NMOS devices 212. A static level shifter 218 performs level shifting functionality from the VDD voltage level to a VDDQX voltage level for PVTN codes.

The control/buffering architecture 202 includes various components to handle incoming signals along a high speed data path, to route signals as appropriate to the pullup or pulldown paths. As described in more detail below, the control/buffering architecture 202 includes components to implement buffering functionality, so that appropriate timing is achieved for input signals to reach corresponding destinations points within the circuit. This architecture is configured to implement the output driver for tri-state operations for a high impedance state, a "1" state, and a "0" state. This allows multiple circuits to share the same output line or lines. In addition, this permits operation for the device to be controlled by an "active low" input (output enable or "OE") which determines whether the output should be held in a high-impedance state or to drive the driver load at "1" or "0".

In operation, transistors 206 perform impedance control across different PVT conditions. The "PD" signal corresponds to the power down signal which will turn-off the output driver and reduce the power consumption. The "PVTP" signal corresponds to the process, voltage and temperature (PVT) dependent codes which are used to control the pull-up impedance across PVT conditions. The VDD level PVTP signals are level shifted to VDDQX levels by using static level shifter 216. If the power down (PD) signal is turned on (logic high), then the control logic/static level shifter 216 and 218 will apply the appropriate control signal to the gates of the transistors 206 and 212 respectively to turn off these devices, thus turning off the supply voltage VDDQ to the output driver. If the PD signal is turned off (logic low), then the control logic/static level shifter 216 takes the PVTP signal and performs level shifting functionality to apply that PVTP signal (through signal PVTPX) to control the operation of the transistors 206 to control pullup impedance for any PVT variations that need to be addressed.

Notably, the control logic/static level shifter 216 and 218 performs level shifting functionality from the VDD voltage level to a VDDQX voltage level. The additional supply VDDQX is provided which is at least one threshold voltage higher than the VDDQ supply. In some embodiments, the VDDQX voltage is set at a fixed 1.2V or 1.1V fixed supply. The use of the additional supply VDDQX at these levels as the gate voltage for devices 206 allows VDDQ to be passed to the output driver devices while providing for a very large overdrive. This, in turn, allows the design to reduce the size of thick-gate devices used in the driver significantly and hence reduces the overall driver area.

Figure 3A:
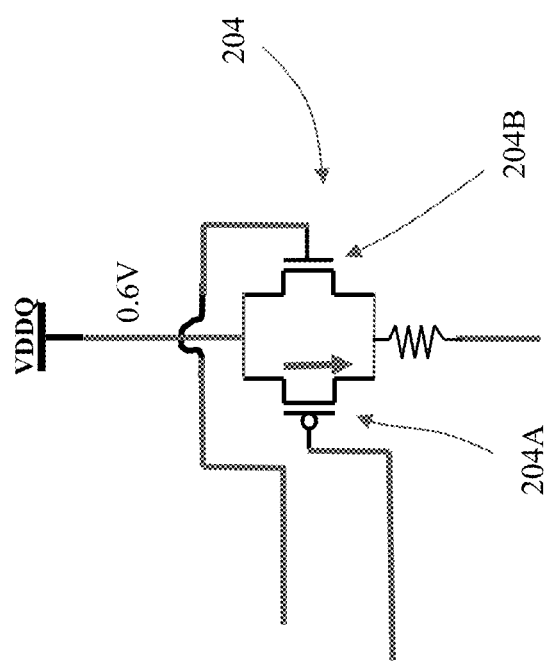
FIGS. 3A and 3B show an illustration of hybrid pull-up driver across wide VDDQ range.
Figure 3B:
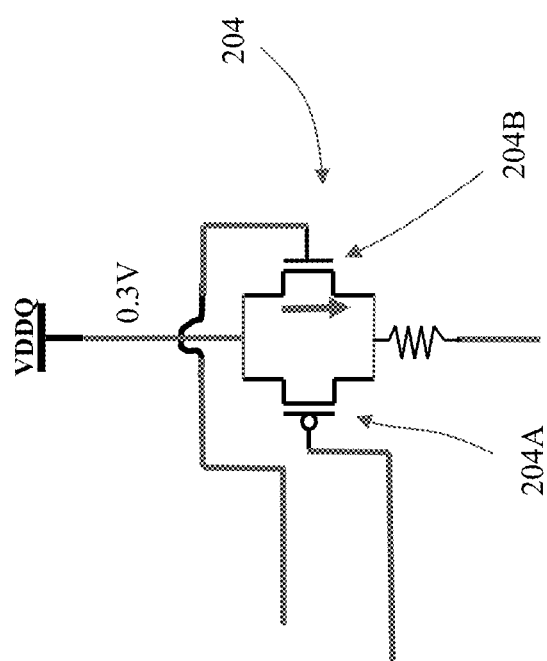

FIGS. 3A and 3B illustrate the operation of the parallel PMOS device 204A and NMOS device 204B within the hybrid pull-up driver 204. As previously noted, one of the issues with advanced memory designs pertains to possible changes/reductions for the DRAM supply voltages. For example, the target VDDQ supply for LPDDR4X DRAM ranges from 0.6V to 0.4V and the target VDDQ supply for LPDDR5 DRAM ranges from 0.5V to 0.3V. The present architecture is fully operational regardless of the exact supply voltage within the possible ranges, even for the smaller 0.3V level VDDQ supply voltages. As illustrated in FIG. 3A, if the VDDQ supply voltage is 0.6V and the PMOS device 204A has a threshold voltage of 0.3V, then the PMOS device 204A will turn on and pass the appropriate voltage level through the device. However, as shown in FIG. 3B, if the supply voltage goes down to 0.3V, and the threshold voltage of the PMOS device 204A is also 0.3V, then this device will not turn on. Instead, as shown in FIG. 3B, the NMOS device 204B will pass the voltage, since the gate voltage of this device is VDD level which is 0.75V.

It is noted that a similar hybrid driver design is not needed in the pulldown path. This is because the 0.75V of the VDD supply as applied to the gate of device 208 can easily pulldown the output voltage level to zero.

Figure 4A:
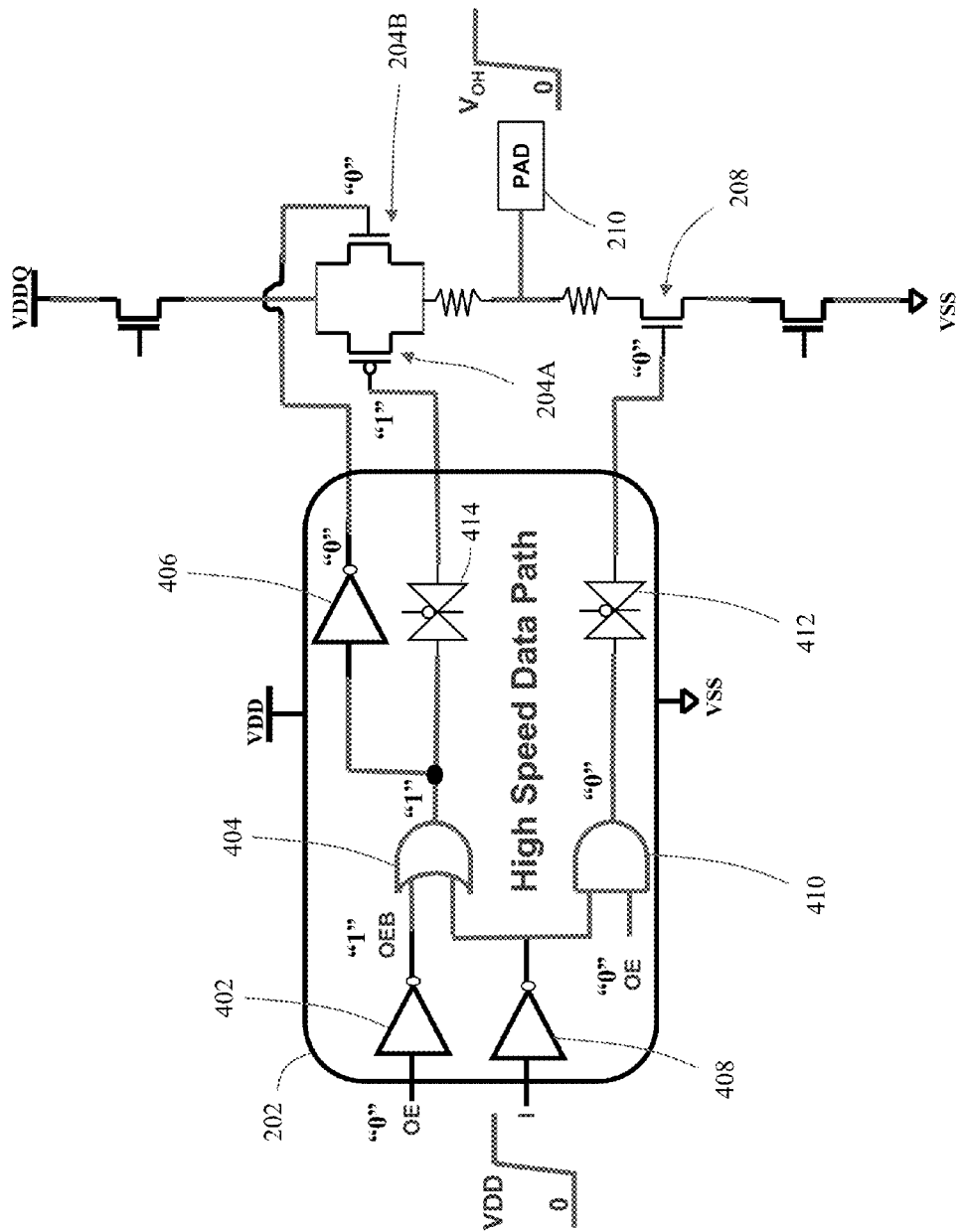
FIGS. 4A-C illustrate various operational aspects of the architecture of the FIG. 2.
Figure 4B:
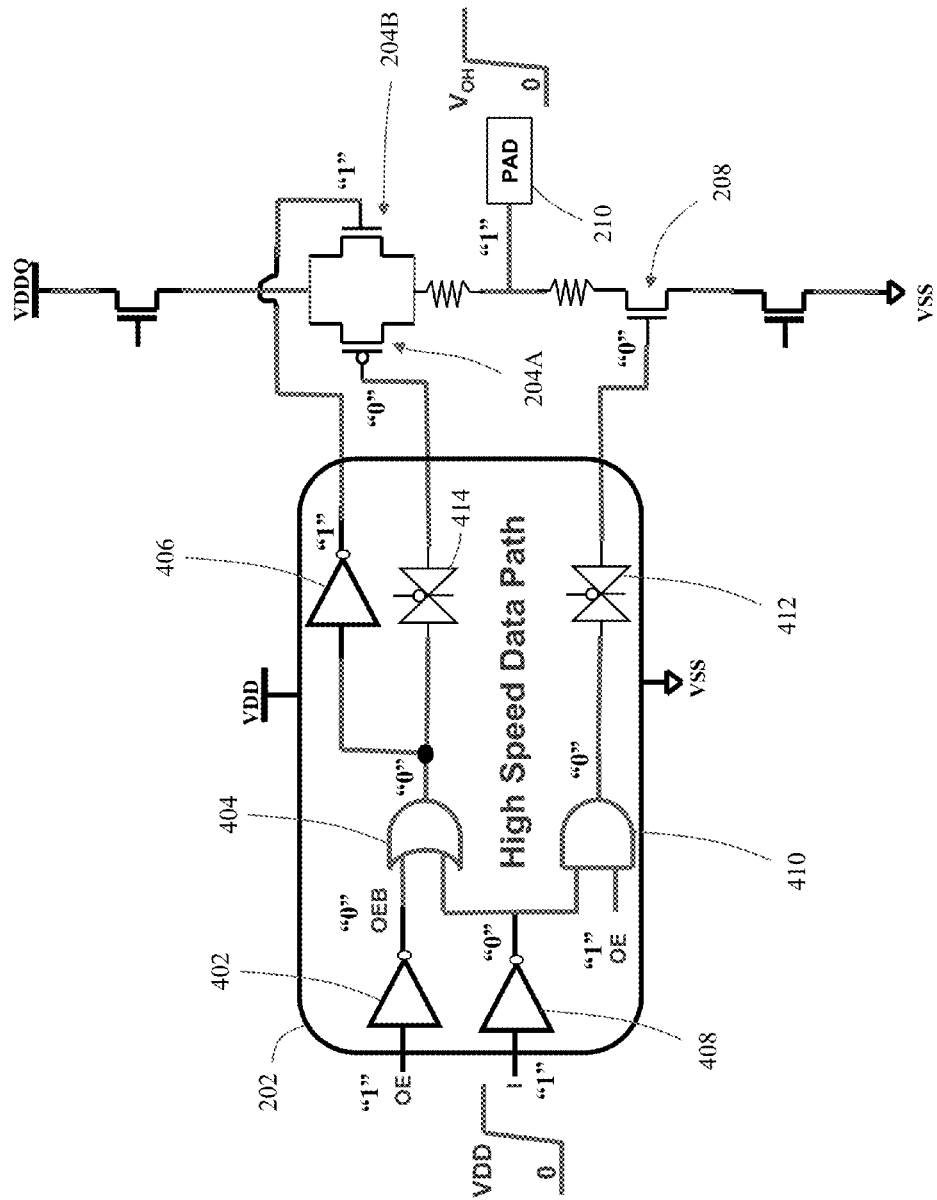
Figure 4C:
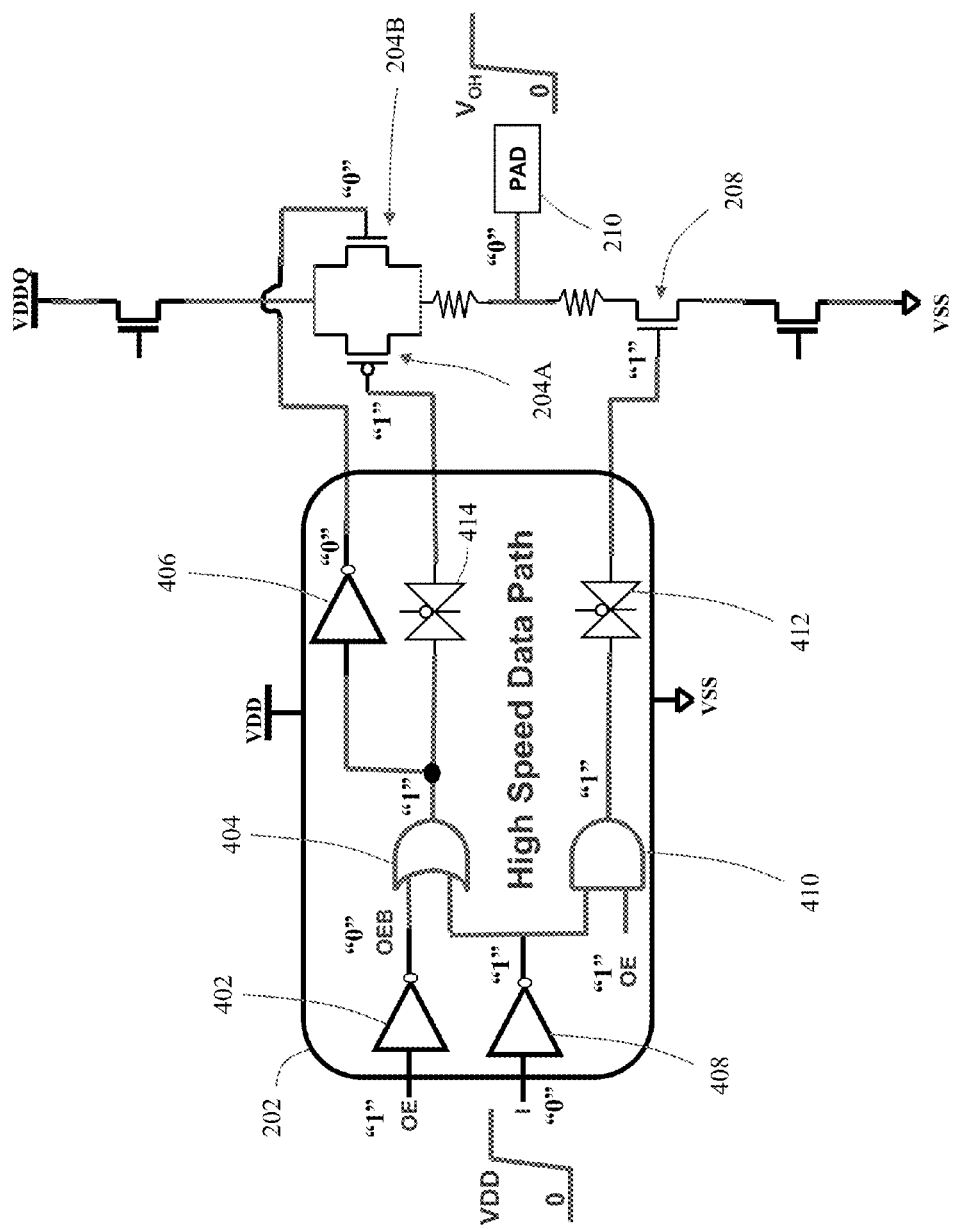

FIGS. 4A-4C illustrate the operation of the control/buffering architecture 202 to handle incoming signals along the high speed data path. The incoming signals include the "OE" and "I" signals. The "I" signal corresponds to the high frequency input signal from the core to the output driver, and extends from 0 to VDD (e.g., 0.75V). The "OE" signal is the output enable or disable signal for the output driver. In high speed applications, the operation to enable the output driver must be handled in a very quick manner. Therefore, the control logic for this signal is placed in the high speed data path to allow the driver to be quickly turned on.

In the tri-state operation of the output driver, FIG. 4A illustrates the output driver in the first state of not having its output enabled.

As shown in FIG. 4A, assume that the OE signal is set to "0" to disable transmission from the output driver. In the pullup path, the inverter 402 will output a "1" signal, which is fed to the input of gate 404. Regardless of the value of the other input to this gate, the output of gate 404 is also "1", which then follows two different paths to reach devices 204A and 204B. On the path to device 204B, the signal is applied to inverter 406 to generate a "0" signal, which is applied to the gate of device 204B, turning this device off. Along the other path to device 204A, the "1" signal passes through a transmission gate 414 to balance the signals along the different paths. The "1" signal is applied to the gate of device 204A, also turning this device off. Since both device 204A and 204B are off, this means that the pullup portion of the architecture is turned off.

In the pulldown path, the "0" OE signal is applied to the input of the AND gate 410, which results in an output "0" from gate 410. This "0" signal is passed to transmission gate 412 on its way to the gate of device 208. The transmission gate 412 is employed to balance the signals along the different paths in the circuit. The "0" signal is applied to the gate of the device 208, turning this device off. Since device 208 is off, the pulldown portion of the architecture is turned off.

In the tri-state operation of the output driver, FIG. 4B illustrates the output driver is in the second state of having the output enabled and the output being driven at the "1" level.

As shown in FIG. 4B, assume that the OE signal is set to "1" to enable transmission from the output driver, and the input signal "I" is also set to high (VDD high of 0.75V or logically "1"). The "1" value of the "I" signal is applied to the input of inverter 408, which generates a "0" at its output and is applied in the pullup path to the input of gate 404. The "1" value of the OE signal is applied to the input of the inverter 402, which outputs a "0" signal that is fed to the other input of gate 404. Therefore, since both inputs to gate 404 is "0", the output of gate 404 is "0", where this value then follows two different paths to reach devices 204A and 204B. On the path to device 204B, the signal is applied to inverter 406 to generate a "1" signal, which is applied to the gate of device 204B, turning this device on. Along the other path to device 204A, the "0" signal is applied to the gate of device 204A, turning this device on. Since both device 204A and 204B are on, the pullup portion of the architecture is turned on, passing the VDDQ voltage level (logically "1") to the Pad 210.

In the pulldown path, the "1" OE signal is applied to a first input of the AND gate 410. In addition, the "1" value of the "I" signal is applied to the input of inverter 408, which generates a "0" at its out and is applied in the pulldown path to the other input of gate 410. These inputs to gate 410 causes an output value of "0" to be output from gate 410. This "0" signal is passed to transmission gate 412 on its way to the gate of device 208. The "0" signal is applied to the gate of the device 208, turning this device off. Since device 208 is off, this means that the pulldown portion of the architecture is turned off.

In the tri-state operation of the output driver, FIG. 4C illustrates the output driver is in the third state of having the output enabled and the output being driven at the "0" level.

As shown in FIG. 4C, assume that the OE signal is set to "1" to enable transmission from the output driver, and the input signal "I" is set to "0". The "0" value of the "I" signal is applied to the input of inverter 408, which generates a "1" at its output and is applied in the pullup path to the input of gate 404. The "1" value of the OE signal is applied to the input of the inverter 402, which outputs a "0" signal that is fed to the other input of gate 404. Therefore, the output of gate 404 is "1". On the path to device 204B, the "1" signal is applied to inverter 406 to generate a "0" signal, which is applied to the gate of device 204B, turning this device off. Along the other path to device 204A, the "1" signal is applied to the gate of device 204A, also turning this device off. Since both device 204A and 204B are off, this means that the pullup portion of the architecture is turned off.

In the pulldown path, the "1" OE signal is applied to the input of the AND gate 410. The "0" value of the "I" signal is applied to the input of inverter 408, which generates a "1" at its output and is applied in the pulldown path to the other input of gate 410. Since both inputs to gate 410 are '1", this causes an output value of "1" to be output from gate 410. This "1" signal is passed to transmission gate 412 on its way to the gate of device 208. The "1" signal is applied to the gate of the device 208, turning this device on. Since device 208 is on, this means that the pulldown portion of the architecture is turned on, pulling the output value applied to pad 210 low to zero volts (logically "0").

This architecture therefore provides an improved approach to implement output drivers for memory components that can handle both the higher levels of target speeds of advanced memory designs, as well as the requirement for lower supply voltages. Since the proposed architecture is free from a level shifter in the high speed data path, it provides better performance across PVT corners. The full data path signaling is on the VDD supply and hence lesser data latency as propagation delay for Input (I) to output (PAD) is very small. Since the VDDQ supply is not used on the gate of any devices, this means that there is less variation in the output impedance across the full range of VDDQ supply ranging from 0.3V to 0.6V. Since the high speed data level shifter is not needed in the data path, significant savings can be obtained for electronic designs relative to area and dynamic power. Therefore, the present architecture can provide a power, performance and area (PPA) efficient high speed driver which can work at speed higher than 6.4 Gbps in the VDDQ range of 0.6V to 0.3V.

It is noted that in some embodiments, the VDDQX supply can be derived internally from VDD supply by using charge pump circuit. This is because in some embodiments, the VDDQX supply is used only in static paths, and therefore no dynamic power is needed from this supply.

Figure 5:
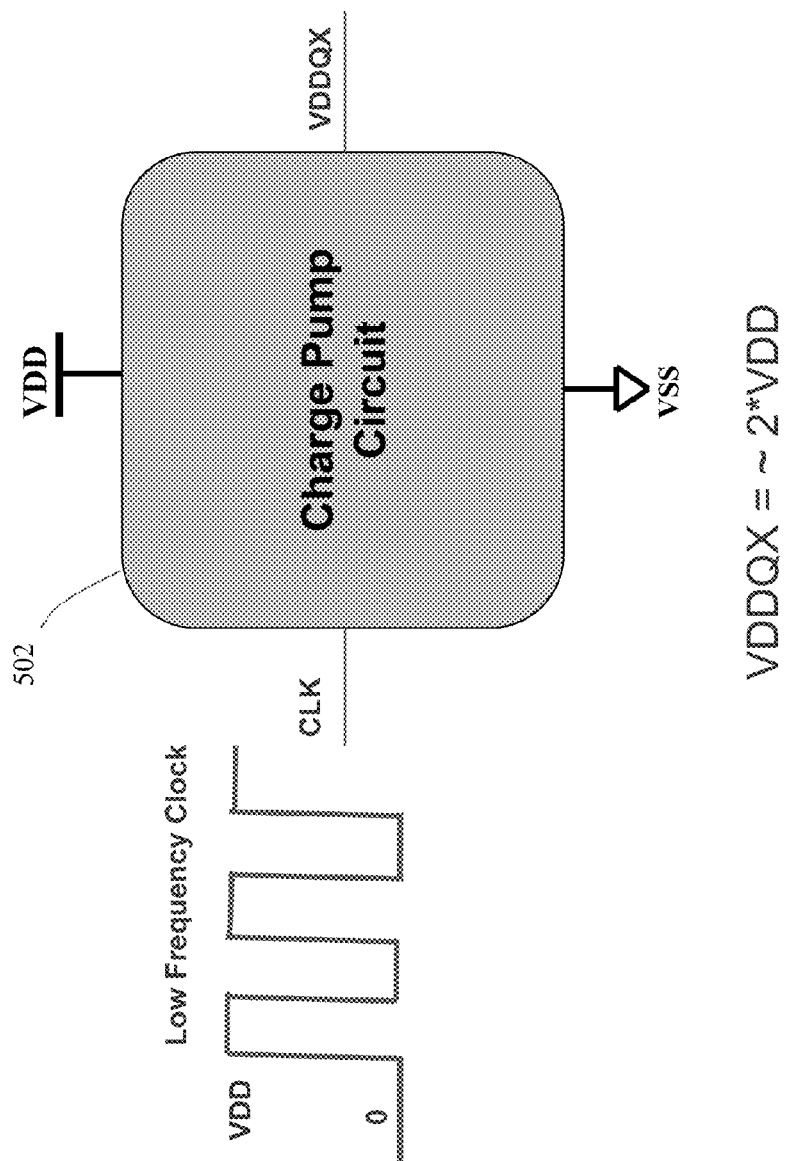
FIG. 5 shows an illustration of an approach whereby the VDDQX supply is derived from the VDD supply.

FIG. 5 shows an illustration of an approach whereby the VDDQX supply is derived from the VDD supply. In the approach shown in this figure, a charge pump circuit 502 is provided to derive the VDDQX supply. A charge pump is a converter mechanism that creates a higher (or lower) power source from an input power source. A low frequency clock is applied to an input of the charge pump circuit 502 to control its switching activity to generate the output VDDQX voltage level.

As is evident to one skilled in the art, other suitable approaches can also be taken to derive the VDDQX supply. For example, a voltage doubler circuit can also be used to generate the VDDQX supply by using the core voltage supply VDD.

Figure 6:
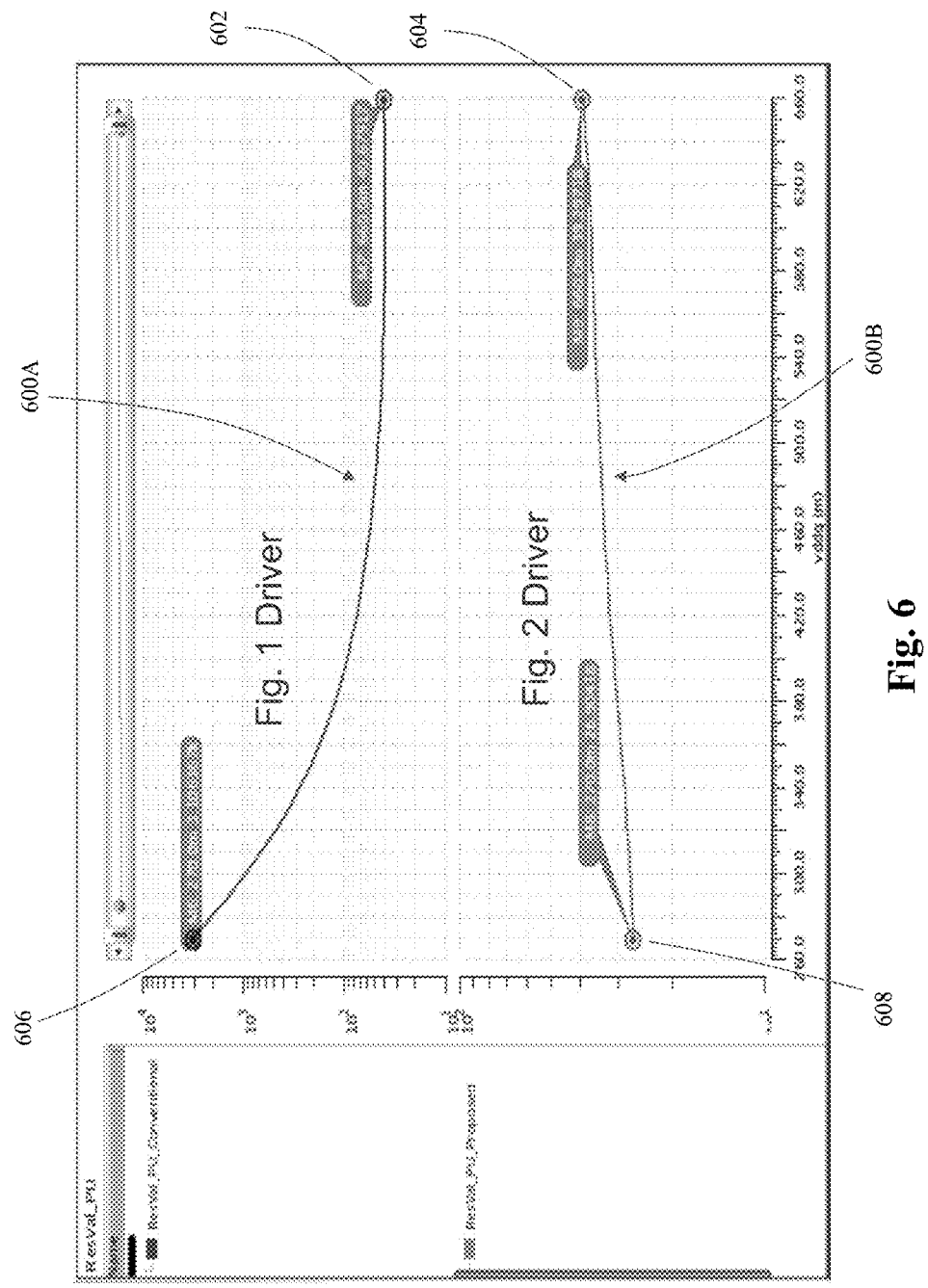
FIG. 6 illustrates examples of the pull-up impedance variations with VDDQ supply for each of the approaches shown in FIG. 1 and FIG. 2.
Figure 7:
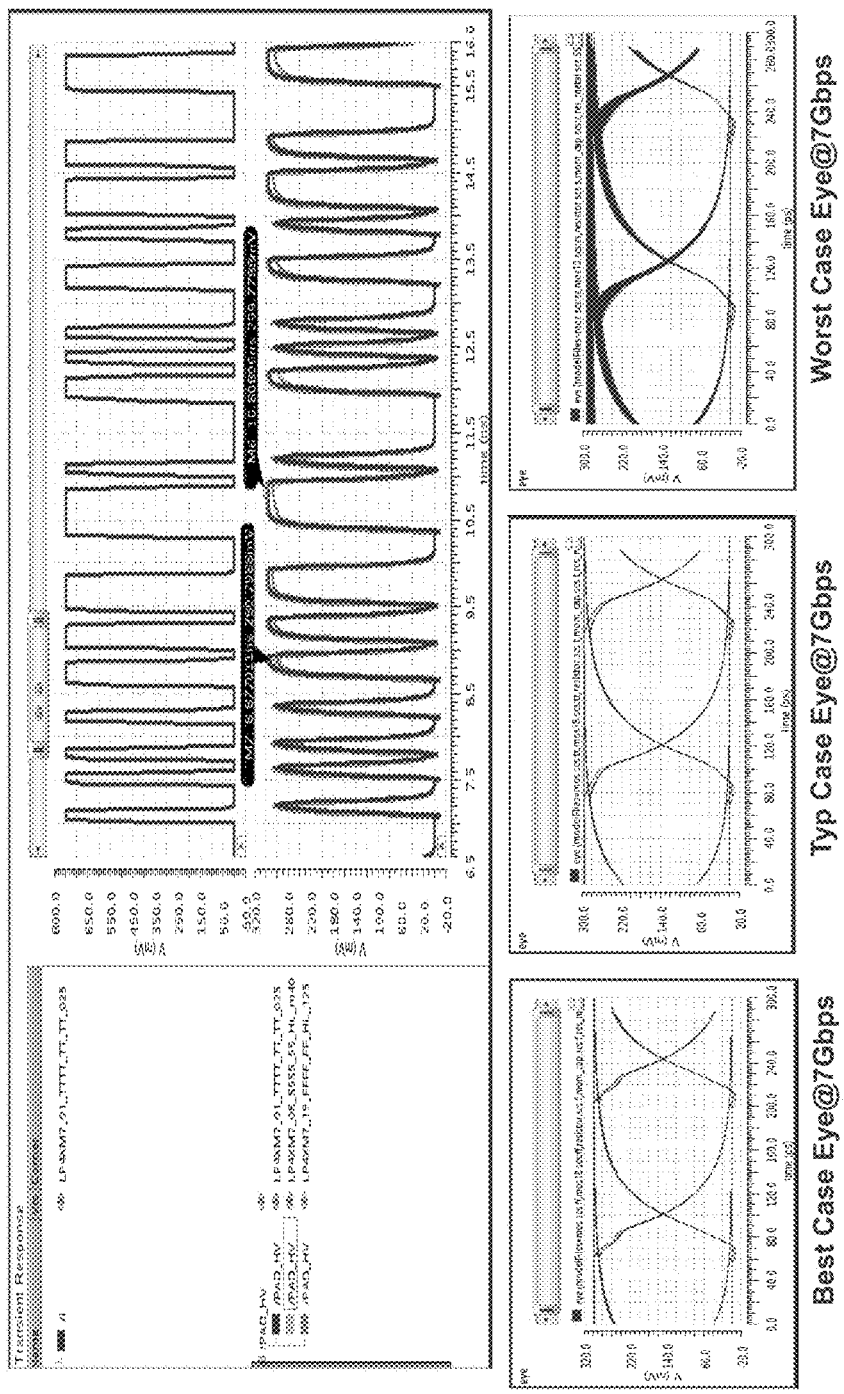
FIG. 7 illustrates example transient performance data for the architecture of FIG. 2, e.g., for LPDDR4X DRAM interface application.
Figure 8:
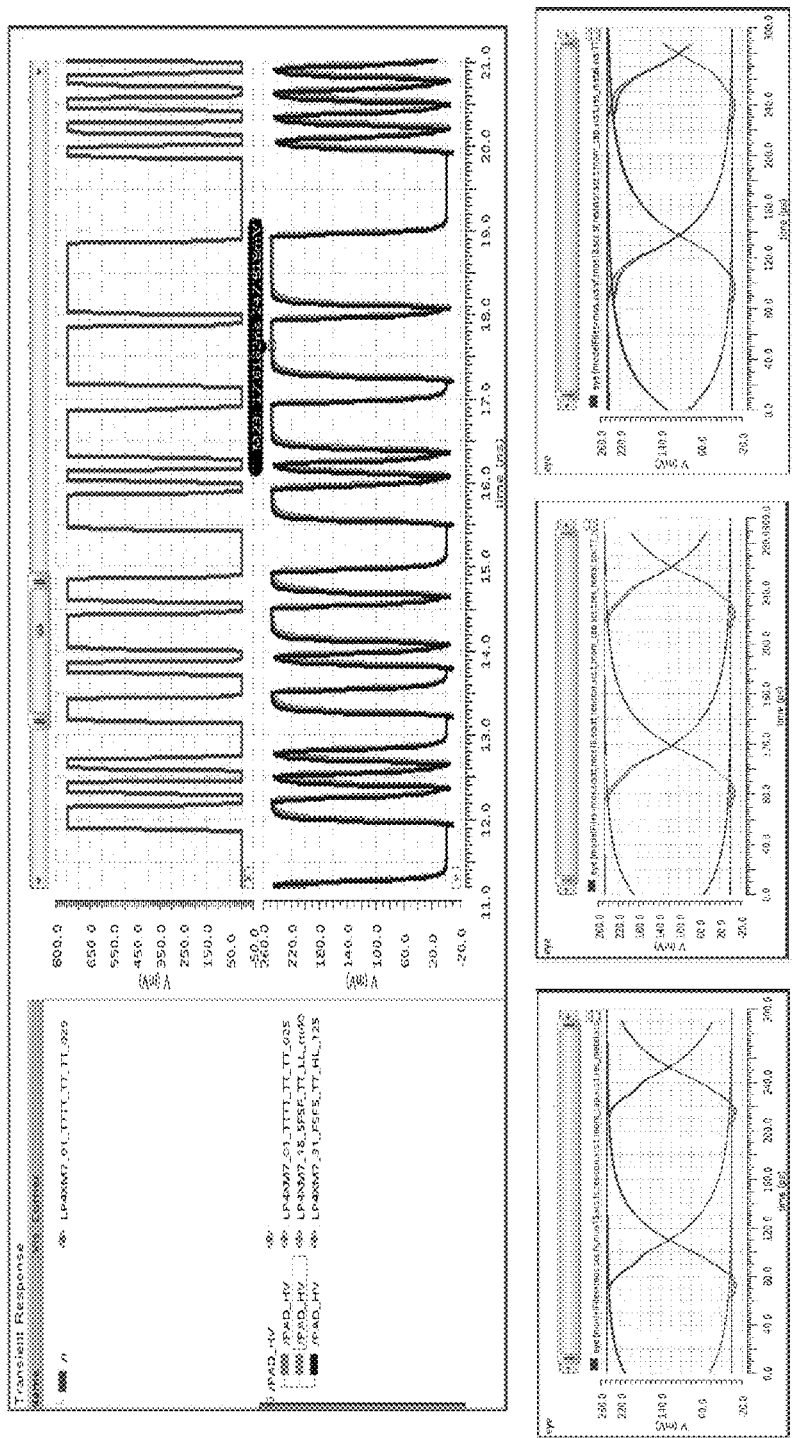
FIG. 8 illustrates another set of example transient performance data for the architecture of FIG. 2, e.g., for LPDDR5 DRAM interface application.

FIGS. 6-8 provide illustrations of certain performance advantages provided by the embodiments of the invention. FIG. 6 illustrates examples of the pull-up impedance variations with VDDQ supply for each of the approaches shown in FIG. 1 and FIG. 2. Plot 600A corresponds to the approach of FIG. 1, while plot 600B corresponds to the approach of FIG. 2. At a supply voltage of 0.6V, both approaches have similar levels of impedance (around 40 ohms), indicated by point 602 for the plot 600A (FIG. 1) and point 604 for plot 600B (FIG. 2). However, significant levels of difference appear when the supply voltage is at 0.3V. For the approach of FIG. 1, the impedance indicated at point 606 on plot 600A is approximately 3 k ohms. In contrast, for the approach of FIG. 2, the impedance indicated at point 608 on plot 600B is approximately 27 ohms. As is evident, there is much less variation associated with the architecture of FIG. 2 as compared to the architecture of FIG. 1.

FIG. 7 illustrates example transient performance data for the architecture of FIG. 2. In particular, the performance data is with respect to 7 Gbps in LPDDR4X mode with VOH=0.5*VDDQ. Similarly, FIG. 8 illustrates example transient performance data for the architecture of FIG. 2 with respect to 7 Gbps in LPDDR5 mode with VOH=0.5*VDDQ. As can be seen, the architecture is validated up to 7 Gbps (which fulfills the need for both LPDDR4X and LPDDR5). However, the architecture can easily work for higher speed, e.g., 9 Gbps and higher.

Therefore, what has been described is an improved approach to an architecture for an output driver that does not employ level shifters in the high speed data path. Since the proposed architecture is free from level shifter in the high speed data path, it provides better performance across PVT corners. The full data path signaling is on the VDD supply, and hence provides lesser data latency as propagation delays from Input to output is very small. Since the VDDQ supply is not used on the gate of any devices, this means that there is less variation in the output impedance across the full range of VDDQ supply ranging from 0.3V to 0.6V. The use of a parallel combination of the thin-gate PMOS and NMOS in the full path of the driver makes the inventive architecture compatible for both LPDDR4X and LPDDR5 modes. Since high speed data level shifters are not needed any further in the data path, this means that there can be significant savings in the area and dynamic power. The use of additional supply VDDQX reduces the size of thick-gate devices used in the driver significantly and hence reduces the driver area.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. An output driver circuit, comprising:
   a first voltage supply corresponding to an input signal voltage level, a second voltage supply corresponding to an output voltage level, and a third voltage supply at a PVT (process, voltage, temperature) control signal voltage level;
   a set of transistor devices electrically coupled to the second voltage supply, wherein the set of transistor devices corresponds to a PVT control input signal at the third voltage level that is applied to the gates of the set of transistor devices;
   a hybrid pullup driver having a PMOS device in parallel with a NMOS device, the hybrid pullup driver being having sources electrically coupled to the set of transistor devices and drains electrically coupled to a pad;
   a pulldown driver having a transistor device electrically coupled to the pad; and
   an input circuit comprising an input signal corresponding to the first voltage level, wherein the input circuit receives the input signal at the first voltage level and generates control signals applied to gates of devices within the hybrid pullup driver or the pulldown driver.

2. The output driver circuit of claim 1, wherein a level shifter is not included in a high speed data path.

3. The output driver circuit of claim 1, further comprising:
   a level shifter electrically coupled to the gates of the set of transistor devices, wherein the level shifter receives a PVT control signal at the first voltage level and level shifts the PVT control signal into the PVT control input signal at the third voltage level.

4. The output driver circuit of claim 3, in which the third voltage level is derived from the first voltage level.

5. The output driver circuit of claim 4, further comprising a charge pump to derive the third voltage level from the first voltage level.

6. The output driver circuit of claim 3, in which the level shifter comprises a static level shifter.

7. The output driver circuit of claim 1, wherein the set of transistor devices comprise thick-oxide devices, and the pullup and pulldown drivers comprise thin-oxide devices.

8. The output driver circuit of claim 1, further comprising:
   a second set of transistor devices electrically coupled to the pulldown driver, the second set of transistor devices corresponding to a second PVT control input signal at the third voltage level that is applied to gates of the second set of transistor devices.

9. The output driver circuit of claim 8, further comprising:
   a second level shifter electrically coupled to the gates of the second set of transistor devices, wherein the second level shifter receives a second PVT control signal at the first voltage level and level shifts the second PVT control signal into the second PVT control input signal at the third voltage level.

10. The output driver circuit of claim 1, wherein the input circuit further comprises a buffer component that manages timing of input signals applied to the pullup driver or the pulldown driver.

11. The output driver circuit of claim 1 corresponding to a DRAM output driver.

12. The output driver of claim 1, wherein the input circuit receives an OE (output enable) signal, and the OE signal controls whether to enable or disable the output driver.

13. A method for operating an output driver circuit, comprising:
receiving an input signal at a first voltage supply corresponding to an input signal voltage level, wherein the input signal is received at an input circuit, the input circuit receiving the input signal at the first voltage level and generates control signals applied to gates of devices within a hybrid pullup driver or a pulldown driver;
controlling the hybrid pullup driver circuit and the pulldown driver with the input signal, the hybrid pullup driver having a PMOS device in parallel with a NMOS device, the pullup driver circuit being having sources electrically coupled to a set of transistor devices and drains electrically coupled to a pad, the pulldown driver having a transistor device electrically coupled to the pad; and
operating the set of transistor devices electrically coupled to a second voltage supply to control impedance levels of the output driver, wherein the set of transistor devices corresponds to a PVT (process, voltage, temperature) control input signal at a third voltage level that is applied to the gates of the set of transistor devices.

14. The method of claim 13, further comprising:
receiving a PVT control signal at the first voltage level at a level shifter; and
level shifting the PVT control signal into the PVT control input signal at the third voltage level.

15. The method of claim 14, in which the third voltage level is derived from the first voltage level.

16. The method of claim 15, wherein the third voltage level the first voltage level using a charge pump.

17. The method of claim 14, in which the level shifter comprises a static level shifter.

18. The method of claim 13, further comprising:
operating a second set of transistor devices electrically coupled to the pulldown driver, the second set of transistor devices corresponding to a second PVT control input signal at the third voltage level that is applied to gates of the second set of transistor devices.

19. The method of claim 18, further comprising:
receiving a second PVT control signal at the first voltage level at a second level shifter; and
level shifting the second PVT control signal into the second PVT control input signal at the third voltage level.

20. The method of claim 13, further comprising implementing a buffer component in the input circuit that manages timing of input signals applied to the pullup driver or the pulldown driver.

21. The method of claim 13, wherein the output driver drives a DRAM device.

22. The method of claim 13, wherein a level shifter is not included in a high speed data path.

* * * * *